United States Patent
Kuo et al.

(10) Patent No.: US 7,510,425 B2
(45) Date of Patent: Mar. 31, 2009

(54) CABLE ASSEMBLY WITH WIRE MANAGEMENT BOARD AND METHOD OF MANUFACTURING THE SAME

(75) Inventors: Peter Kuo, Tu-cheng (TW); Zhi-Yong Li, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/900,386

(22) Filed: Sep. 11, 2007

(65) Prior Publication Data

US 2008/0064254 A1  Mar. 13, 2008

(30) Foreign Application Priority Data

Sep. 11, 2006  (TW)  ............................... 95133419 A

(51) Int. Cl.
*H01R 12/24* (2006.01)
(52) U.S. Cl. .................. 439/493; 439/497; 439/579; 439/942
(58) Field of Classification Search .................. 439/493, 439/497, 579, 942, 329
See application file for complete search history.

(56) References Cited

U.S. PATENT DOCUMENTS

| | | | |
|---|---|---|---|
| 4,770,645 A * | 9/1988 | Antes | 439/329 |
| 5,049,090 A * | 9/1991 | Johnson | 439/493 |
| 5,344,338 A * | 9/1994 | Colleran et al. | 439/465 |
| 6,380,485 B1 | 4/2002 | Beaman | |
| 6,540,548 B1 | 4/2003 | Zhang | |
| 6,685,501 B1 | 2/2004 | Wu | |
| 6,786,762 B2 * | 9/2004 | Buck et al. | 439/493 |
| 6,802,744 B2 | 10/2004 | Chiang | |
| 6,869,308 B2 | 3/2005 | Wu | |

* cited by examiner

*Primary Examiner*—Tho D Ta
(74) *Attorney, Agent, or Firm*—Wei Te Chung

(57) ABSTRACT

A cable assembly (100) according to the present invention includes a number of wires (4) each having an inner conductor (41) and an insulation layer (42) enclosing the conductor, a PCB (2) having opposite rear and front ends, an upper surface (21) and a number of conductive pads (23) formed with said upper surface, and at least one wire management board (3, 3') each defining opposite top and bottom surfaces and having a base mounted on said upper surface of the PCB and a number of wire management slots (32, 32') formed integrally with said base and extending toward said conductive pads of the PCB. The inner conductors are received in the corresponding wire management slots and physically and electrically connect with the corresponding conductive pads.

13 Claims, 7 Drawing Sheets

CABLE ASSEMBLY WITH WIRE MANAGEMENT BOARD AND METHOD OF MANUFACTURING THE SAME

BACKGROUND OF THE INVENTION

1. Field of the Invention

This invention generally relates to a cable assembly, and more particularly, to a cable assembly with a wire management board for a PCB and wires thereof.

2. Description of the Prior Art

U.S. Pat. No. 6,685,501 B1 discloses a high speed cable connector including a cover, a base and a cable assembly mounted between the cover and the base. The cable assembly includes a cable consisting of a plurality of lines. Each line has a signal pair and a ground conductor. The signal pair includes a pair of upper and lower signal conductors. The ground conductors are soldered to shielding plates. The shielding plates are soldered to top and bottom faces of a rear end of a printed circuit board (PCB). The upper and lower signal conductors of each signal pair are soldered to the top and bottom faces of the rear end of the PCB, respectively, and located between two neighboring shielding plates, whereby cross-talk and interference between two neighboring signal pairs can be effectively suppressed and reduced. The PCB has a front end electrically connecting with contacts for electrically engaging with a complementary connector. However, it is very complicated to solder so many shielding plates onto the PCB.

Hence, an improved cable assembly is desired to overcome the above problems.

BRIEF SUMMARY OF THE INVENTION

It is an object of the present invention to provide a cable assembly with a wire management board for a PCB.

It is another object of the present invention to provide a method to manufacture a cable assembly with a wire management board for a PCB.

In order to attain the object above, a cable assembly according to the present invention comprises a plurality of wires each having an inner conductor and an insulation layer enclosing the conductor, a PCB having opposite rear and front ends, an upper surface and a plurality of conductive pads formed with said upper surface, and at least one wire management board each defining a top and bottom surfaces and having a base mounted on said upper surface of the PCB and a plurality of wire management slots formed integrally with said base and extending toward said conductive pads of the PCB. The inner conductors are received in the corresponding wire management slots and physically and electrically connect with the corresponding conductive pads.

In order to attain the object above, a method to manufacture a cable assembly according to the present invention comprises the steps as follow. First, provide a plurality of wires each having an inner conductor and an insulation layer enclosing the inner conductor, a PCB having a rear end and a front end and an upper surface and a plurality of conductive pads formed with said upper surface, and at least one wire management board each having a base and a plurality of wire management slots adjacent to said inner conductors and formed integrally with the base. Secondly, assemble said at least one wire management board onto the PCB. Finally, assemble said wires onto the PCB and insert the inner conductors of the wires into the corresponding wire management slots and make the inner conductors connecting the corresponding conductive pads.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Reference will now be made in detail to the preferred embodiment of the present invention.

As shown in FIGS. 1-7, a cable assembly 100, 100' according to the present invention comprises a printed circuit board (PCB) 2, a plurality of wires 4 physically and electrically connecting with the PCB 2 and wire management boards 3, 3' to position the wires 4.

Figure 5:
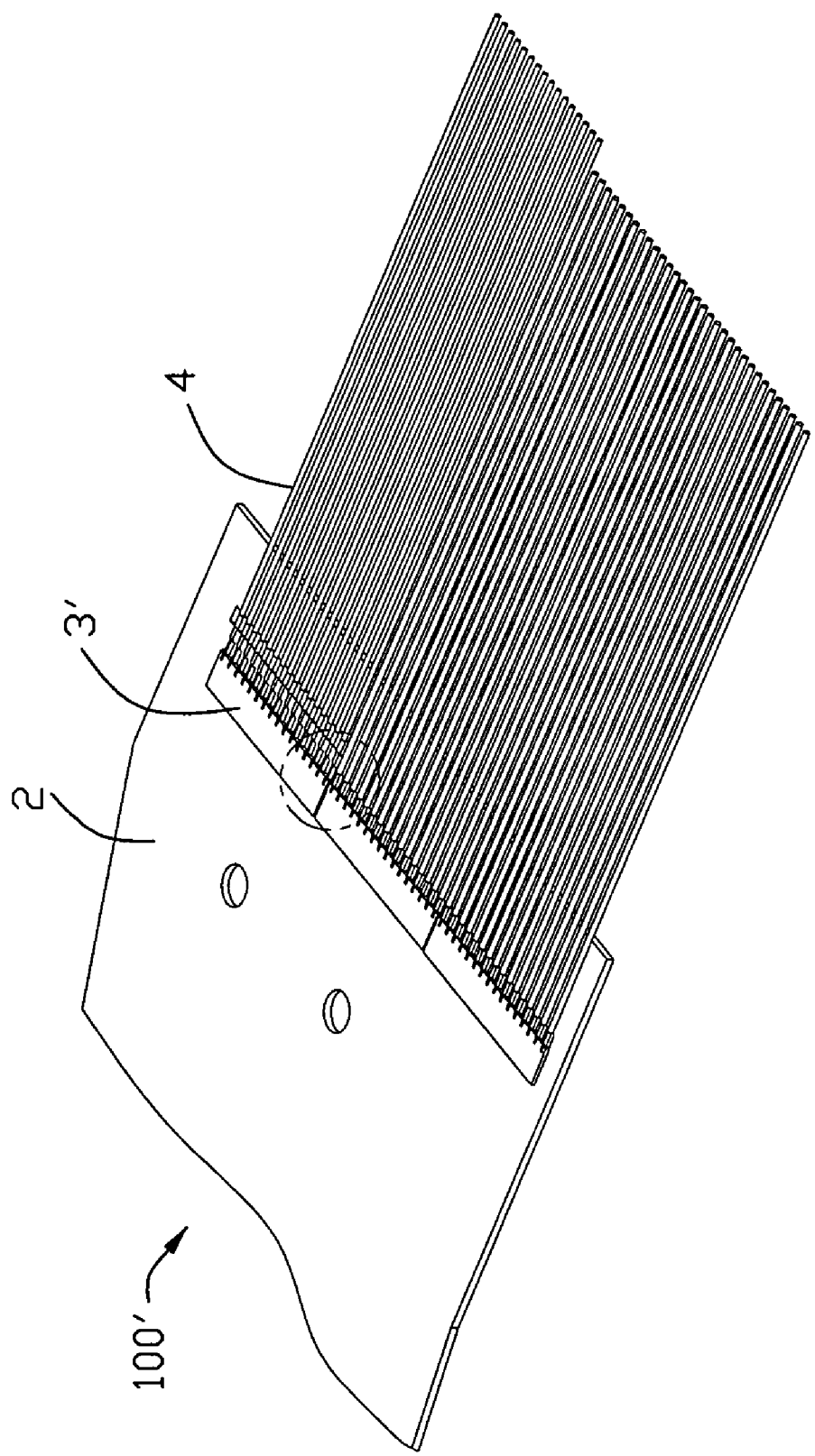
FIG. 5 is an assembled view of a cable assembly according to a second embodiment of the present invention.
Figure 6:
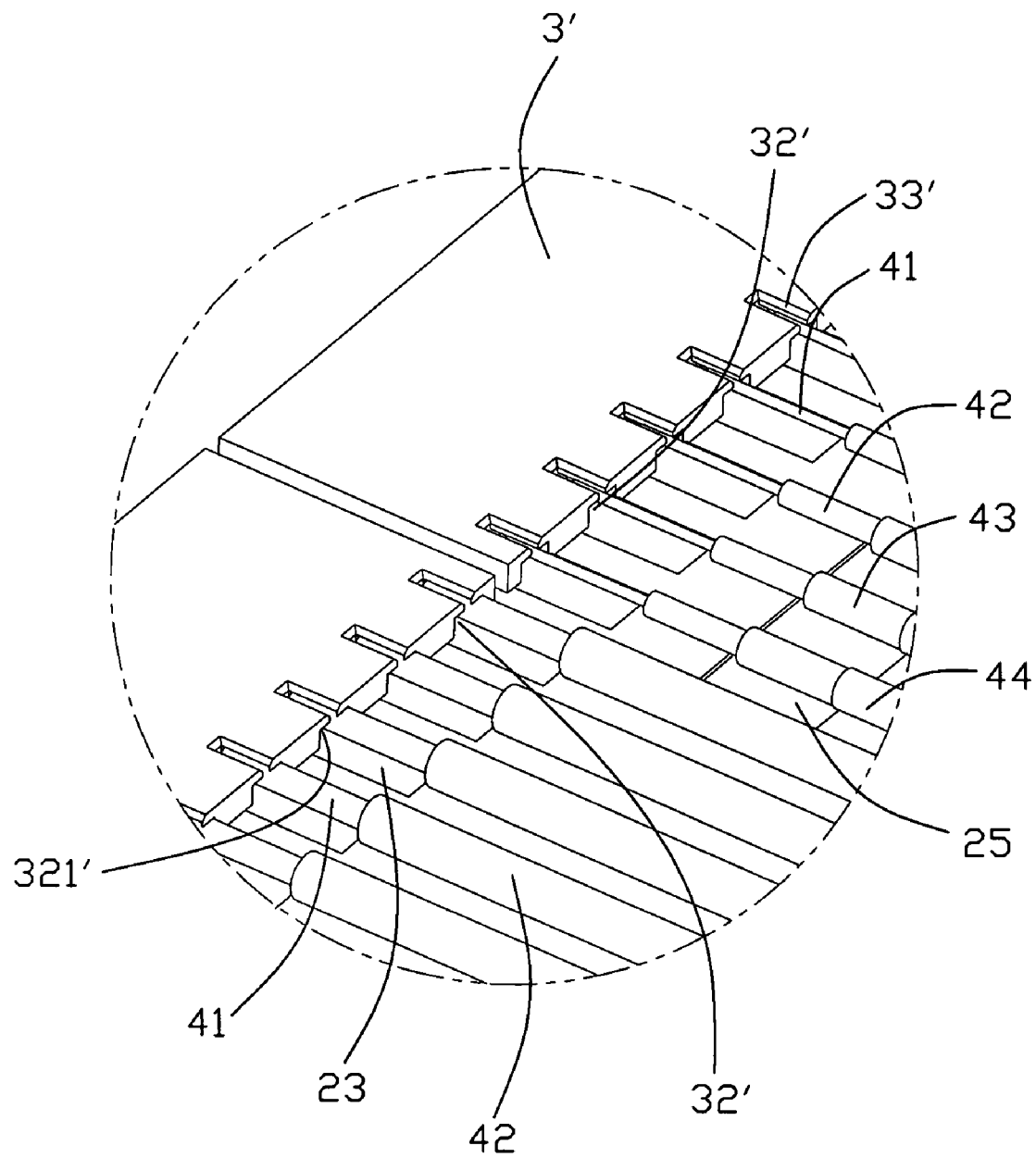
FIG. 6 is an amplificatory, partial view of the cable assembly shown in FIG. 5.

FIGS. 1-4 show a cable assembly 100 according to a first embodiment of the present invention. FIGS. 5-6 show another cable assembly 100' according to a second embodiment of the present invention.

The manufacturing process of the cable assembly 100, 100' is as follows.

Provide a PCB 2. Please referring to FIGS. 1 and 2, the PCB 2 includes an upper surface 21 defining a plurality of conductive pads 23 on the rear portion thereof, and a lower surface 22 opposite to the upper surface 21. All the conductive pads 23 are arranged in a single line and electrically connect with the wires 4. Three pairs of small-size receiving holes 24 lie in front of the conductive pads 23 to assemble the wire management boards 3, 3' onto the PCB 2. A conductive grounding strip 25 stands behind the conductive pads 23 and on the right side of the PCB 2. The PCB 2 has a pair of large-size retention holes 26 to hold the PCB 2 on a laptop or other electric devices. A front end (not shown) of the PCB 2 is formed with a plurality of golden fingers and inserted into and electrically connects with a connector socket of a LCD panel of the laptop or other electric devices. Some conductive pathways (not shown) formed in inner layers or on the upper and lower surfaces 21, 22 of the PCB 2 connect the conductive pads 23 and the conductive grounding strip 25 with the golden fingers, and further with the connector socket.

Figure 1:
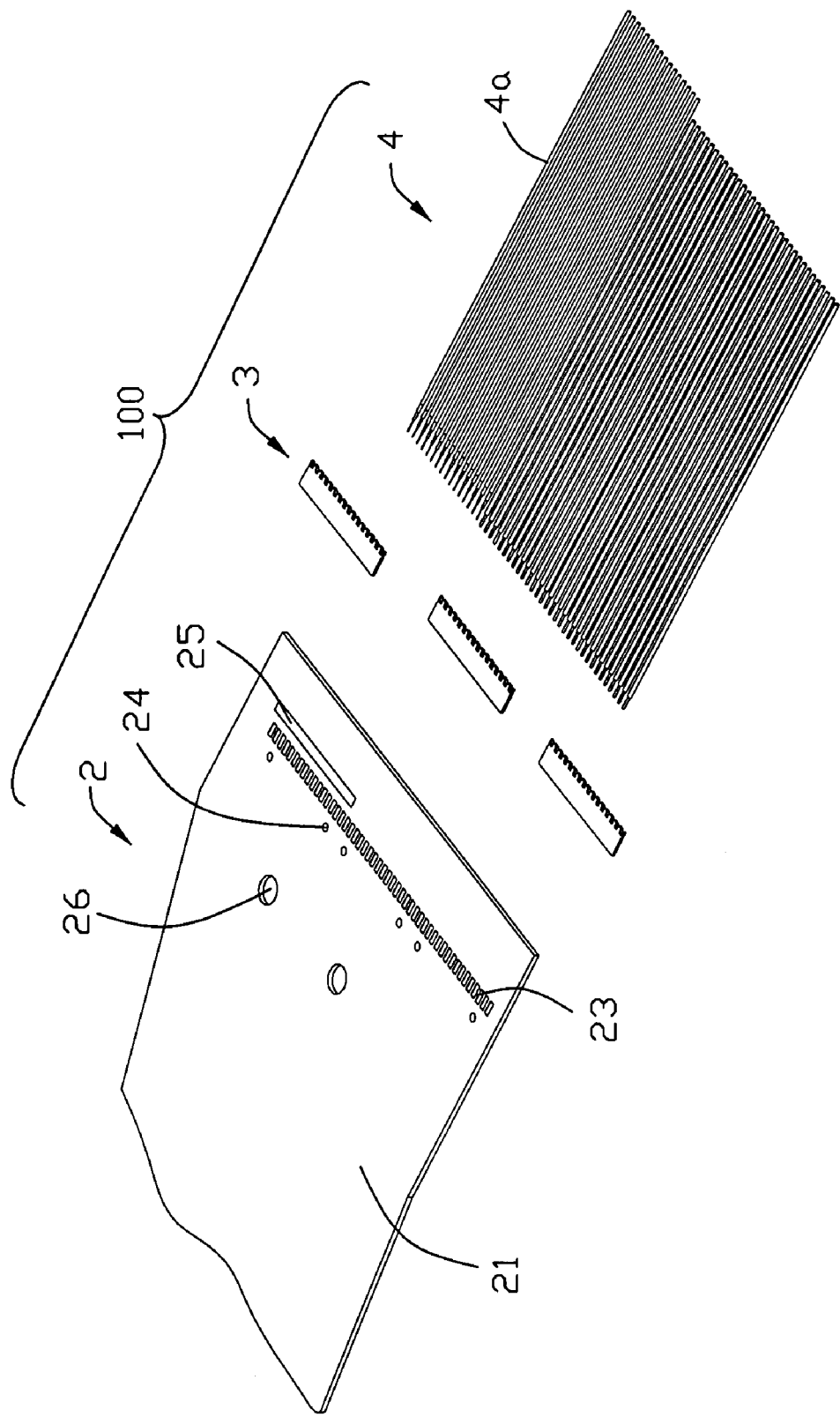
FIG. 1 is an exploded, perspective view of a cable assembly according to a first embodiment of the present invention.
Figure 2:
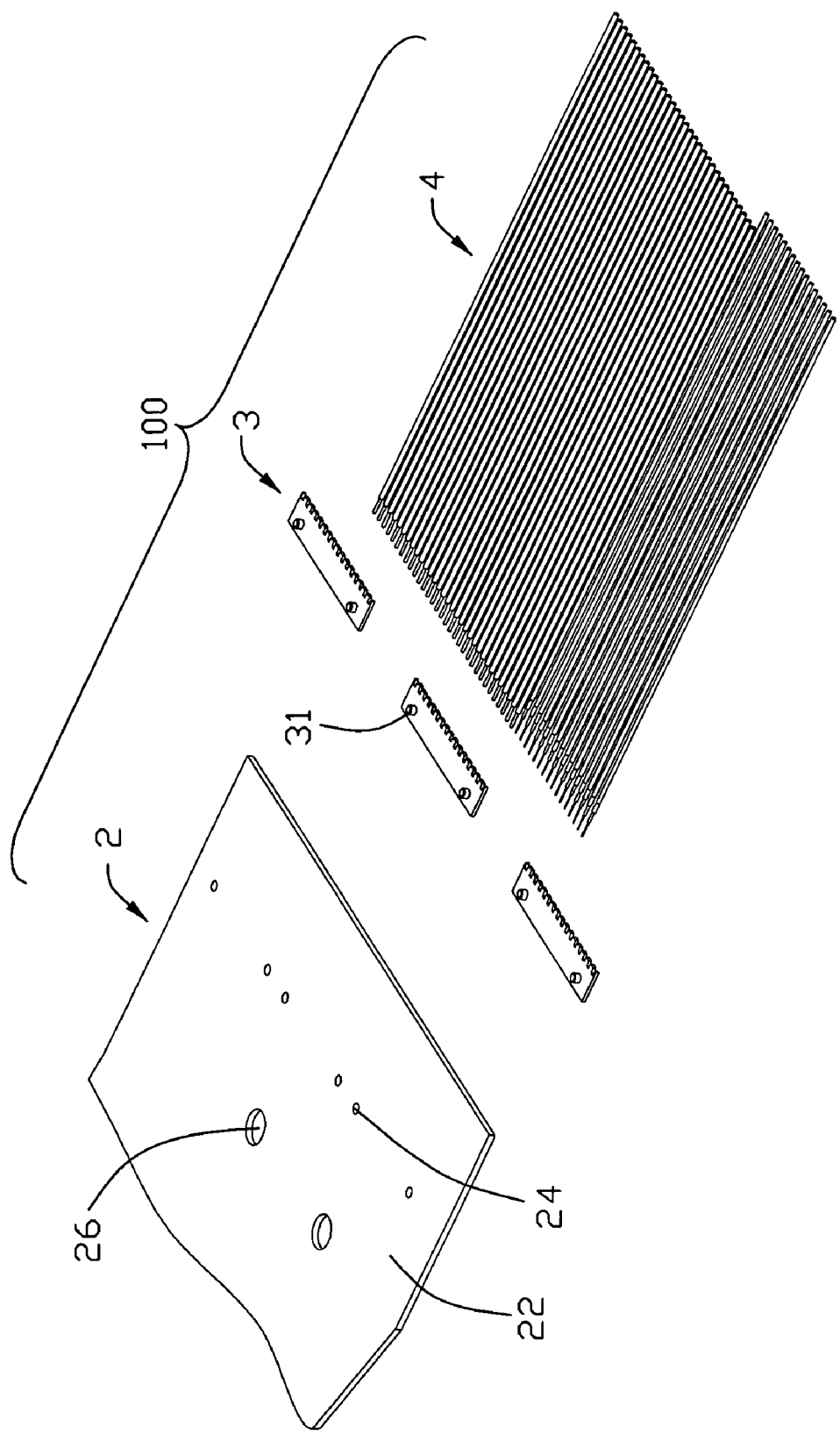
FIG. 2 is a view similar to FIG. 1, but viewed from another aspect.
Figure 3:
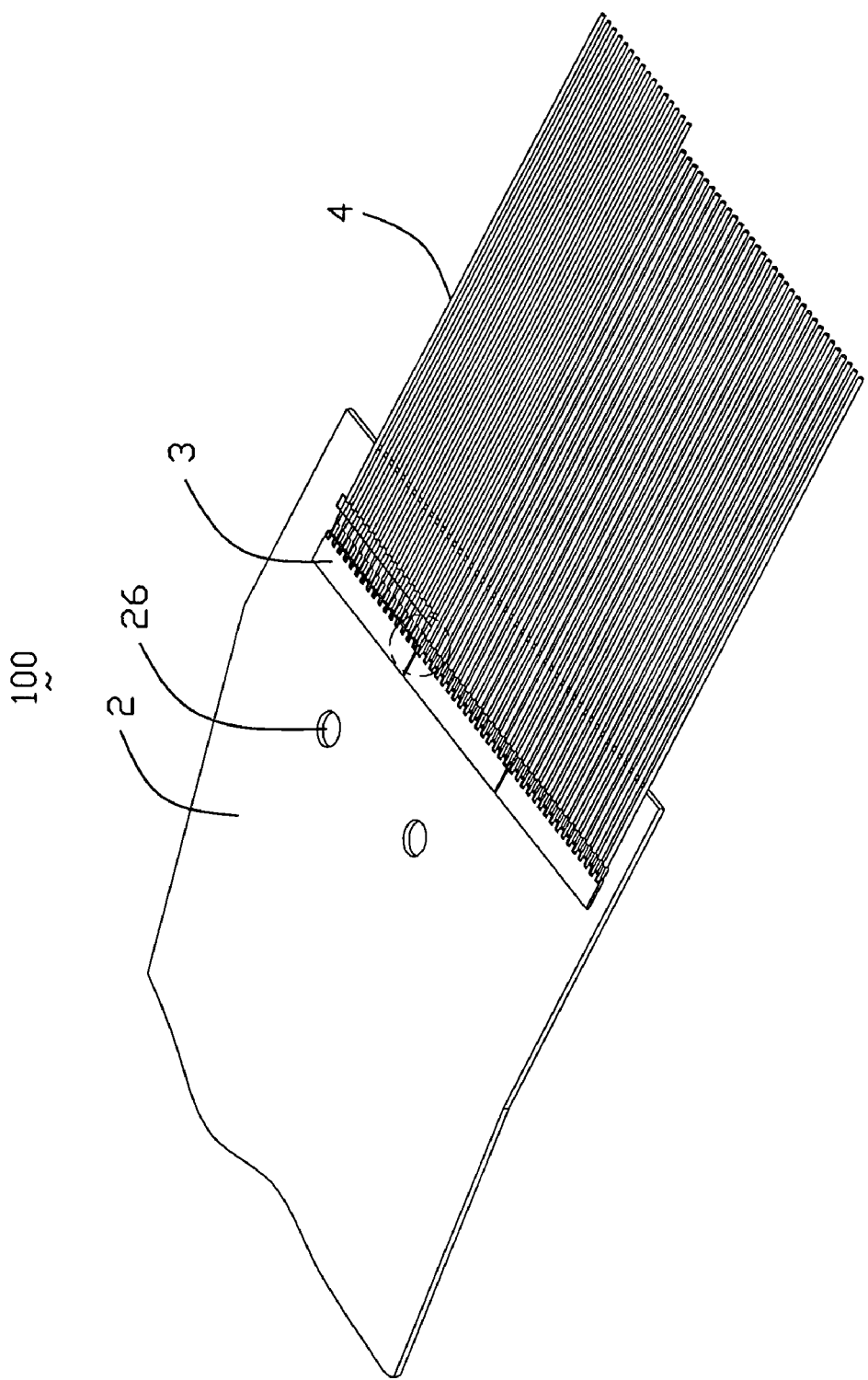
FIG. 3 is an assembled view of the cable assembly shown in FIG. 1.
Figure 4:
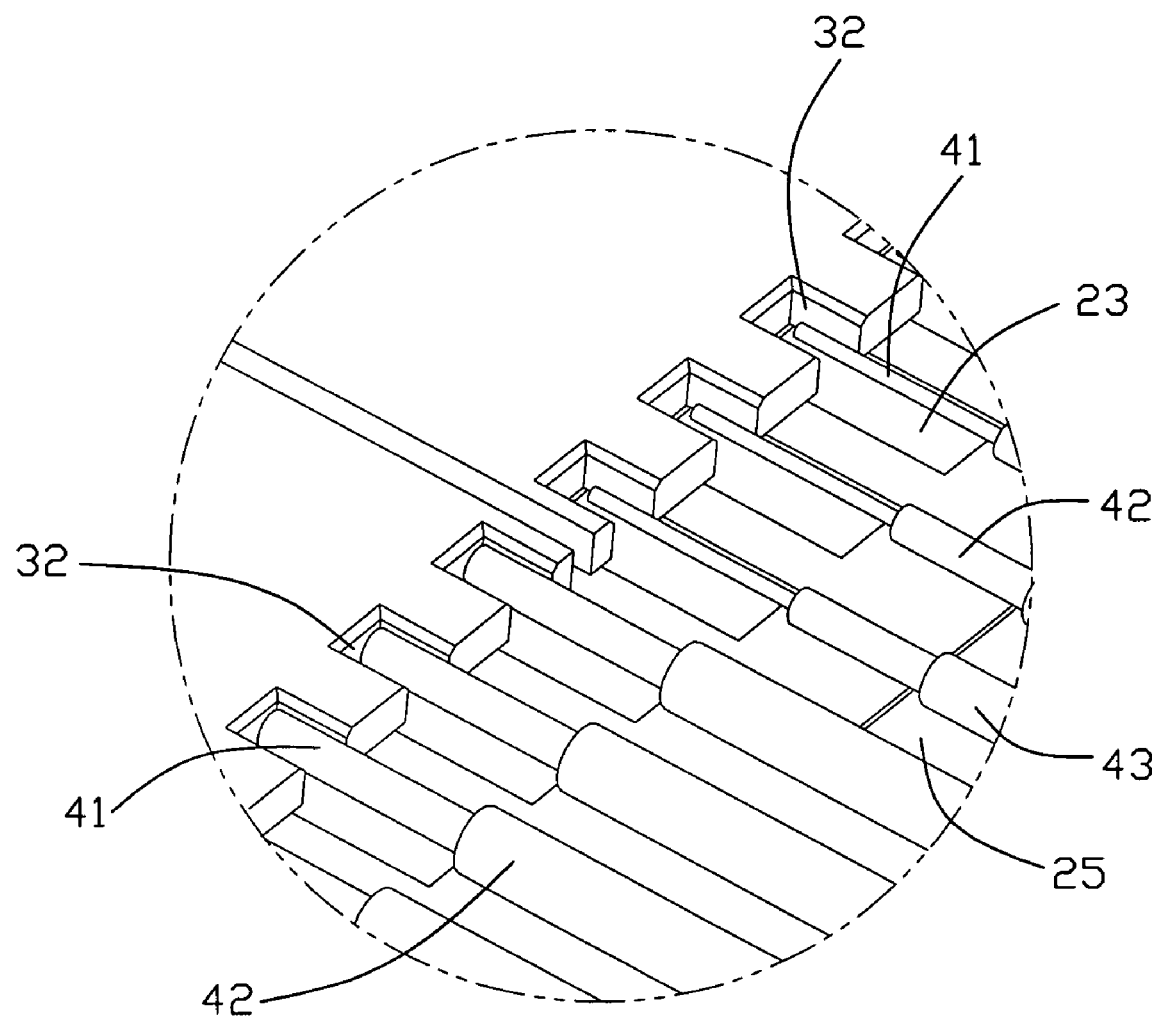
FIG. 4 is an amplificatory, partial view of the cable assembly shown in FIG. 3.

Provide a plurality of wires 4, please referring to FIG. 2, FIG. 4 and FIG. 6. Each wire 4 comprises an inner conductor 41 and an insulation layer 42 covering the conductor 41.

Thereinto, some are micro coaxial cables 4a (FIG. 1) used for signal transmission, the others for power transmission. Each coaxial cable 4a further includes a shielding layer 43 covering the insulation layer 42 and an outer jacket layer 44 in the outermost thereof. The coaxial cable' inner conductors are thinner than the other's. The inner conductors 41 and the shielding layers 43 are respectively soldered onto the conductive pads 23 and the conductive grounding strip 25.

Provide at least one wire management board 3, 3'. Each wire management board 3, 3' is made of plastic material and installed on the upper surface 21 of the PCB 2. In both the first and second embodiments according to the present invention, because too many wires 4 need to be managed and a too long wire management board is difficult to make, there are three discrete wire management boards 3, 3'. Of course, to replace the three wire management boards by a single one doesn't affect the function and effectiveness of the invention. A pair of protruding posts 31 are formed at opposite sides of the bottom surface of each wire management board 3, 3' to interferentially engage with the receiving holes 24 of the PCB 2 in order to fix the wire management board 3, 3' on the PCB 2. Each wire management board 3, 3' has a rectangular base and defines in the rear portion thereof a plurality of wire management slot 32, 32' to align and accommodate front ends of the wires 4. In the first embodiment, referring to FIGS. 3 and 4, each wire management slot 32 is rectangular, and runs through the top and bottom surfaces in the vertical direction to communicate with the PCB 2 and outside, and opens back in the front-to-rear direction to insert the wires 4 into the wire management slot 32 from the rear-to-front direction. The conductive pads 23 are respective under the corresponding wire management slots 32 so that the inner conductors 41 received in the wire management slots 32 stand on and electrically connect with the corresponding conductive pads 23. The wire management boards 3 with wire management slots 32 can effectively reduce the difficulty of wires array, reduce production time and cost. Moreover, even if the inner conductors 41 received in the wire management slots 32 may still swing, it can prevent solder bridge by the wire management boards 3.

FIGS. 5 and 6 provide another wire management boards 3'. The wire management slots 32' formed in the wire management boards 3' provide an additional function of fixing wires 4, compared with the ones 32 shown in FIGS. 1 to 4. Each wire management slot 32' is rectangular, and runs through the top and bottom surfaces in the vertical direction to communicate with the PCB 2 and outside, and opens back in the front and rear direction. The height of the wire management slots 32' in the vertical direction are roughly equal to the diameter of the wider wire 4. Thus, when inserted into the wire management slots 32', the front ends of the wider wires 4 are held between top walls 321' formed on the wire management slots 32' and the conductive pads 23. As having small size, the micro coaxial cables 4a received in the wire management slots 32' are allowed to move a little to prevent from breaking. Each wire management slot 32' defines through the top wall 321' a guiding cut 33' to guide the wire 4 into the wire management slot 32'. Each guiding cut 33' is trapeziform so to prevent the wire 4 in the wire management slot 32' from moving back.

Assemble the wire management boards 3, 3' onto the PCB 2 with the wire management slots 32, 32' aligning with the corresponding conductive pads 23.

Position the wires 4 in the corresponding wire management slots 32, 32' and on the corresponding conductive pads 23.

Please referring to FIGS. 4 and 6, the rear portions of the conductive pads 23 are exposed outside of the wire management slots 32, 32' along the front-to-back direction, and the rear portions of the bare inner conductors 41 extend backwards beyond the wire management slots 32, 32' and stand on and electrically connect the conductive pads 23.

Figure 7:
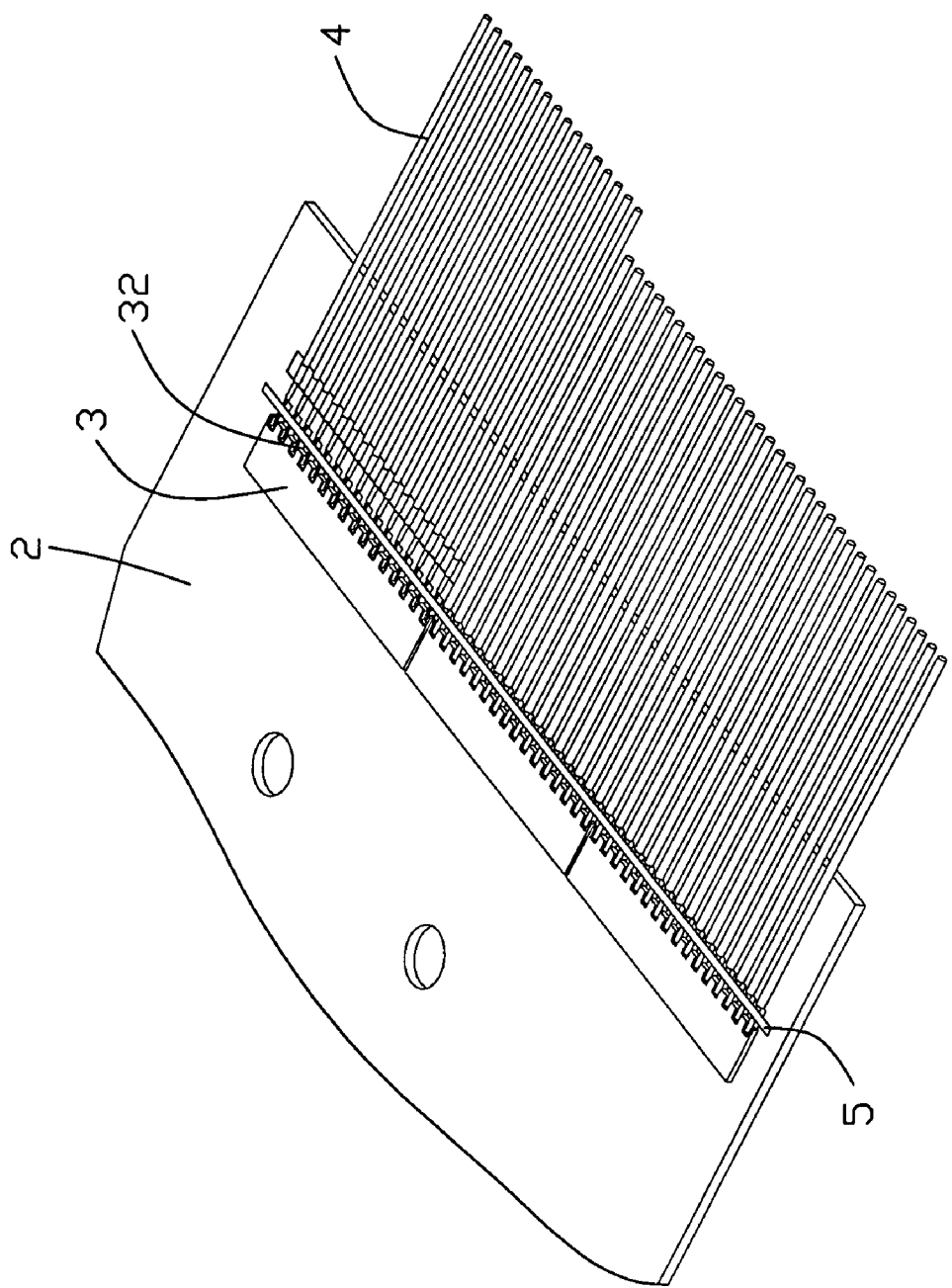
FIG. 7 is an assembled view of the cable assembly according to the first embodiment of the present invention, which shows a solder bar soldered onto a plurality of wires.

Put a solder bar 5 onto the rear portions of the bare inner conductors 41, referring to FIG. 7. Then solder the bare inner conductors 41 on the conductive pads 23 by the means of hot bar soldering. In this process, you'd better use a tool to prevent the melted tin from soldering on the adjacent wires 4.

Solder all the shielding layers 43 on the conductive grounding strip 25. Thus, the entire manufacturing process is complete.

Please note that the wire management boards 3, 3' may be removed after the wires 4 are soldered. Of course, in some applications, you may also retain these wire management boards 3, 3'.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A cable assembly, comprising:
a plurality of wires each having an inner conductor and an insulation layer enclosing the inner conductor;
a PCB having opposite rear and front ends, an upper surface and a plurality of conductive pads formed with said upper surface; and
at least one wire management board each defining opposite top and bottom surfaces and having a base mounted on said upper surface of the PCB and a plurality of wire management slots formed integrally with said base and extending toward said conductive pads of the PCB, said inner conductors received in the corresponding wire management slots and physically and electrically connecting with the corresponding conductive pads;
wherein at least one of said wire management slots extends beyond the bottom surface of the wire management board so that the conductor received in said slot electrically connects the corresponding conductive pad, and said conductor is clamped and held by a top wall of said wire management slot and said corresponding conductive pad.

2. The cable assembly according to claim 1, wherein one of the bottom surface of said at least one wire management board and the upper surface of the PCB form a protruding post, and the other of the bottom surface of said at least one wire management board and the upper surface of the PCB form a receiving hole to receive said protruding post.

3. The cable assembly according to claim 1, wherein at least one of said wire management slots forms a guiding cut through said top wall of said wire management board to guide said conductor into said slot.

4. The cable assembly according to claim 1, wherein the whole wire management board stands on the upper surface of the PCB.

5. The cable assembly according to claim 1, wherein at least one of said wire management slots opens back in the front-to-rear direction.

6. The cable assembly according to claim 1, wherein said at least one of said wire management board is removable mounted on said upper surface of the PCB.

7. A method to manufacture a cable assembly, comprising the steps of:
- providing a plurality of wires each having an inner conductor and an insulation layer enclosing the inner conductor, a PCB having a rear end and a front end and an upper surface and a plurality of conductive pads formed with said upper surface, and at least one wire management board each having a base and a plurality of wire management slots adjacent to said inner conductors and formed integrally with the base;
- assembling said at least one wire management board onto the PCB; and
- assembling said wires onto the PCB and inserting the inner conductors of the wires into the corresponding wire management slots and making the inner conductors connecting the corresponding conductive pads;
- wherein the bare inner conductors are partially exposed outside of the corresponding wire management slots, and the conductive pads are partially exposed outside of the corresponding wire management slots, and the step of making the inner conductors connecting the corresponding conductive pads comprises the steps of putting a solder bar on the bare inner conductors and the conductive pads exposed outside of the wire management slots and the step of soldering the bare inner conductors on the corresponding conductive pads by the means of hot bar soldering.

8. The method to manufacture a cable assembly according to claim 7, wherein further comprises the step of removing said at least one wire management board from the PCB after the step of making the inner conductors connecting the corresponding conductive pads.

9. The method to manufacture a cable assembly according to claim 7, wherein one of the bottom surface of said at least one wire management board and the upper surface of the PCB form a protruding post, and the other of the bottom surface of said at least one wire management board and the upper surface of the PCB form a receiving hole to receive said protruding post.

10. The method to manufacture a cable assembly according to claim 7, wherein at least one of said wire management slot extends through the bottom surface of the wire management board so that the conductor received in said slot electrically connect the corresponding conductive pad, and goes through the top surface of the wire management board in order to insert the conductor from said top surface.

11. A cable assembly comprising:
- a printed circuit board defining a face on which at least one row of conductive pads formed therein;
- at least one insulative wire management device mounted to the face adjacent to said conductive pads, and defining a plurality of partitions with a plurality of slots respectively formed between every adjacent two partitions under a condition that said slots respectively receive the corresponding conductive pads therein; and
- a plurality of wires each including at least one inner conductor respectively received in the corresponding slots with thereunder the corresponding conductive pads soldered thereto; wherein
- a top wall is formed above each of said slot so as to have a front end of the inner conductor of the corresponding wire is protectively located thereunder; wherein
- said top wall defines a slit to upwardly expose the corresponding slot thereunder.

12. The cable assembly as claimed in claim 11, wherein a large grounding pad is formed on the face, and cooperates with said wire management device to be respectively located by two sides of said at least one row of conductive pads.

13. The cable assembly as claimed in claim 11, wherein said wire management device is essentially of a board-like configuration.

* * * * *